(12) United States Patent
Lim

(10) Patent No.: US 9,596,748 B2
(45) Date of Patent: Mar. 14, 2017

(54) LENS MOUNT WITH CONDUCTIVE GLUE POCKET FOR GROUNDING TO A CIRCUIT BOARD

(71) Applicant: STMicroelectronics Pte Ltd., Singapore (SG)

(72) Inventor: Wee Chin Judy Lim, Singapore (SG)

(73) Assignee: STMicroelectronics Pte Ltd, Singapore (SG)

( * ) Notice: Subject to any disclaimer, the term of this patent is extended or adjusted under 35 U.S.C. 154(b) by 1022 days.

(21) Appl. No.: 13/852,373

(22) Filed: Mar. 28, 2013

(65) Prior Publication Data

US 2014/0293558 A1 Oct. 2, 2014

(51) Int. Cl.
*H05K 1/02* (2006.01)
*H05K 9/00* (2006.01)

(52) U.S. Cl.
CPC ......... *H05K 1/0215* (2013.01); *H05K 9/0024* (2013.01); *H05K 9/0039* (2013.01); *H05K 2201/2018* (2013.01); *Y10T 29/49124* (2015.01)

(58) Field of Classification Search
None
See application file for complete search history.

(56) References Cited

U.S. PATENT DOCUMENTS

| 8,522,051 B2* | 8/2013 | Hankhofer | H05K 5/0208 29/846 |
| --- | --- | --- | --- |
| 2005/0161587 A1* | 7/2005 | Mihara | H01L 21/6835 250/214 R |
| 2009/0115891 A1* | 5/2009 | Ryu | H04N 5/2253 348/374 |
| 2012/0177358 A1* | 7/2012 | Wittenberg | G03B 11/00 396/448 |
| 2013/0322039 A1* | 12/2013 | Teysseyre | H05K 9/003 361/753 |
| 2014/0048997 A1* | 2/2014 | Cheng | H05K 1/189 269/303 |
| 2014/0177181 A1* | 6/2014 | Malek | H05K 9/003 361/749 |

* cited by examiner

*Primary Examiner* — Courtney Smith
*Assistant Examiner* — Jessey R Ervin
(74) *Attorney, Agent, or Firm* — Seed Intellectual Property Law Group LLP

(57) ABSTRACT

A lens mount is attached to a circuit board and covers electrical components on the circuit board. An electrically insulating device is positioned between the lens mount and the circuit board. The circuit board includes a grounding pad adjacent the electrically insulating device. The lens mount includes an aperture aligned with the grounding pad and the electrically insulating device. A conductive glue is dispensed into the aperture to electrically ground the lens mount to the grounding pad. The electrically insulating device seals the conductive glue from the electrical components. A method of grounding a lens mount to a circuit board is provided.

19 Claims, 5 Drawing Sheets

LENS MOUNT WITH CONDUCTIVE GLUE POCKET FOR GROUNDING TO A CIRCUIT BOARD

BACKGROUND

Technical Field

The present disclosure relates generally to electrical devices, and more particularly, to an aperture in a lens mount to electrically ground and physically attach the lens mount to a circuit board.

Description of the Related Art

Camera modules are important devices for the inputting and outputting of digital information via electronic devices. The digital camera module is becoming more and more useful in electronic devices, such as mobile phones, computers, and webcams. Due to the increasingly thinner and smaller size of electronic devices, the digital camera modules are being adapted to fit into such devices while still operating effectively. Existing lens bodies of camera modules are not directly attached to a circuit board; instead, there is typically an intervening holder/body between the lens mount and the circuit board, thereby requiring additional manufacturing steps to attach the mount to the circuit board. Moreover, lens bodies must be properly grounded to the circuit board to prevent electrostatic discharge to critical components of the digital camera module, such as transistors and charge-coupled devices. Proper grounding poses difficulties when working with very small components of camera modules. For example, conductive glue may be used between the lens body and the circuit board to ground the lens body. The conductive glue can leak or seep onto the electrical components of the circuit board, which damages such components. Moreover, because of the relatively high viscosity of conductive glues and the very small components of digital camera modules, it is quite difficult to attach the lens body to the circuit board (and/or the intervening holder) and to effectively ground the lens body to the circuit board without causing said leakage, all while minimizing manufacturing steps for mass production of digital camera modules.

BRIEF SUMMARY

According to one aspect of the present disclosure, a cover or lens mount is grounded to a circuit board by conductive glue positioned in at least one aperture of the cover. The conductive glue is configured to electrically ground the cover to the circuit board to prevent electrical damage to the camera modules. The conductive glue is sealed in the at least one aperture to prevent electrical damage to electrical components of the circuit board. The conductive glue and the aperture may be configured to structurally attach the cover to the circuit board.

In some aspects, an electronic device includes a circuit board, an insulation member, and a cover. The circuit board includes a grounding pad, a substrate, and at least one electrical component. The substrate includes a receiving surface for receiving the insulation member. The grounding pad is proximate the receiving surface. The insulation member is attached to the receiving surface and extends around a perimeter of the grounding pad. The insulation member may be a very thin layer of electrically insulating material, such as having a thickness of 20 microns or less. The cover is attached to the insulation member on the circuit board such that the insulation member is positioned therebetween.

The cover includes at least one aperture extending through the cover. The at least one aperture is aligned with the ground pad of the circuit board. A conductive glue is injected into and positioned in the at least one aperture such that the conductive glue is in electrical contact with the cover and the grounding pad. Thus, the conductive glue electrically grounds the cover to the circuit board to prevent electrostatic discharge. Advantageously, the conductive glue is positioned in the aperture adjacent the insulation member such that the conductive glue is sealed in the aperture and such that seepage of the conductive glue is prevented, which could damage electrical components if seepage occurs.

According to one aspect of the present disclosure, a method includes electrically grounding a cover to a circuit board. The grounding includes attaching an insulation member to a surface of the circuit board and attaching the cover to the insulation member. The cover includes at least one aperture positioned adjacent a grounding pad of the circuit board. The method includes inserting a conductive glue into the at least one aperture. The cover is attached to the insulation member and the insulation member is cured, thereby attaching the cover to the circuit board and electrically insulating the cover from the circuit board. The method includes inserting a conductive glue into the at least one aperture through a tip that may have a diameter between 400 and 500 microns, and preferably 400 microns or smaller, although the size of the tip may vary depending upon the application.

Accordingly, the present disclosure allows for mass production of covers attached to circuit boards and grounded to the circuit boards while sealing the conductive glue from critical electrical components of the circuit boards, and with minimal steps to achieve attachment and grounding of the cover. In addition, the overall height of the electronic device is reduced compared to existing devices because the only device between the cover and the circuit board is the insulation member, which may be less than 20 microns thick.

DETAILED DESCRIPTION

Figure 1:
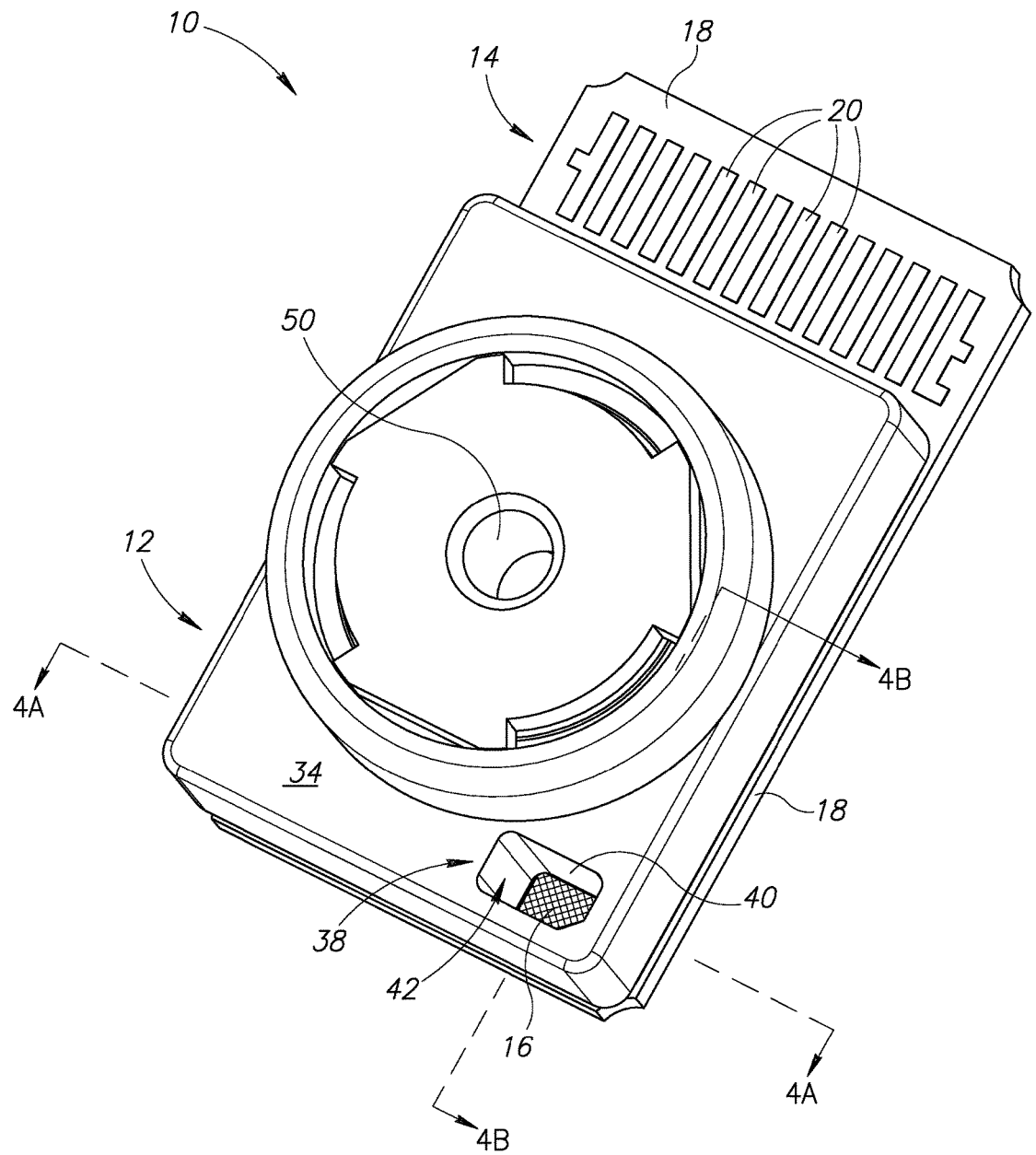
FIG. 1 is an isometric view of an electronic device having a cover coupled to a circuit board according to an aspect of the present disclosure.
Figure 2:
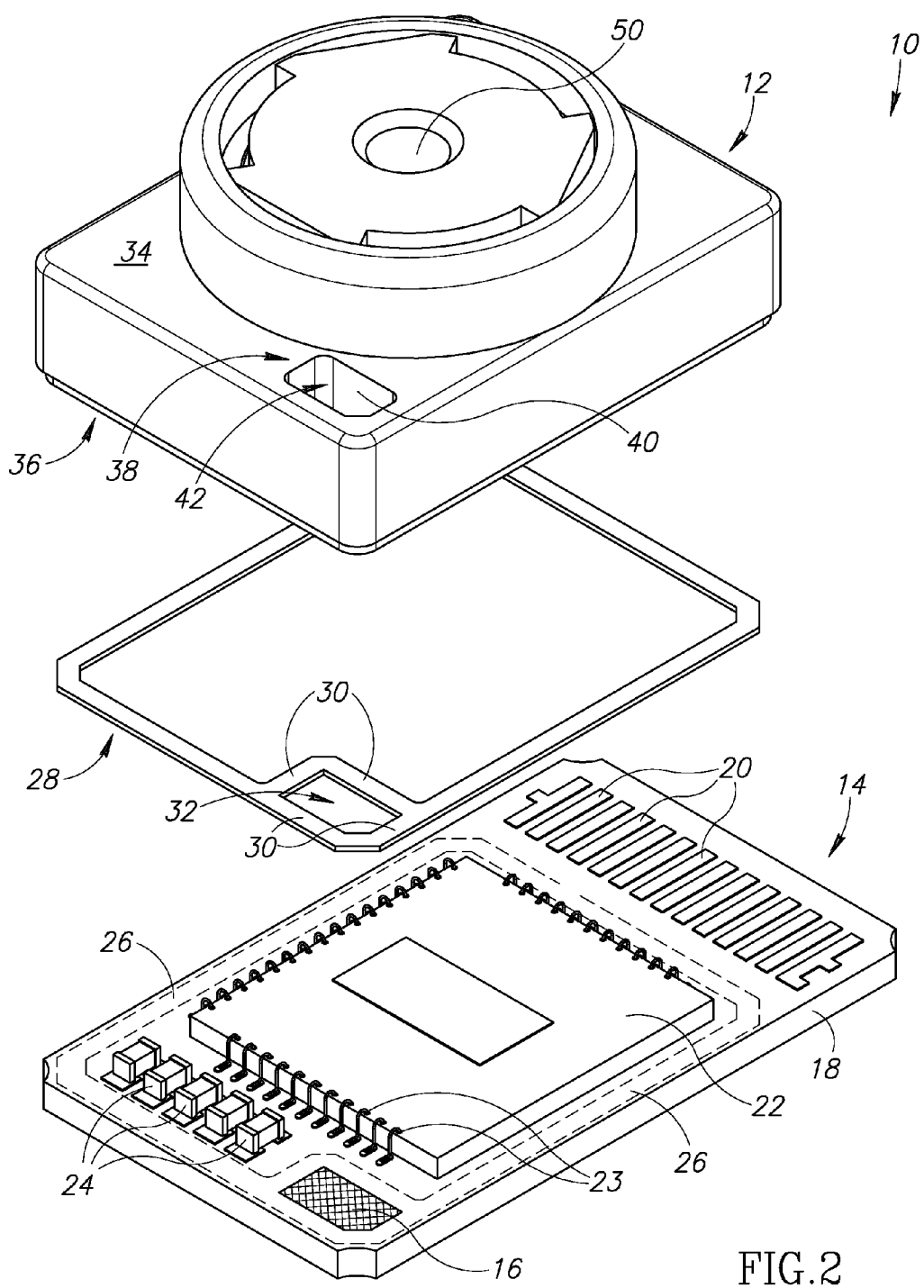
FIG. 2 is a partially exploded view of the electronic device of FIG. 1.

FIGS. 1 and 2 show an electronic device 10 according to one aspect of the present disclosure. The electronic device 10 includes a cover 12 and a circuit board 14. The cover 12 may be a lens mount 12. The circuit board 14 includes a grounding pad 16, a substrate 18, electrical leads 20, a sensor 22, and other electronic components 24, either passive or active, such as transistors, resistors, or capacitors. The sensor 22 may be a charge coupled device, an acoustic sensor, a light-sensitive device, or other suitable sensing device. The sensor 22 is a die or chip, which may or may not be in a separate package. For example, the die of the sensor 22 may be packaged separately and then attached to the substrate 18 or the die may be directly coupled to the substrate.

The electrical leads 20 are coupled to electrical traces in the substrate 18, which traces also couple the sensor 22 and the electronic components 24 to each other. The leads 20 can couple the device 10 to a computer system, a mobile cell phone, a tablet computer, or the like. There are electrical connections 23 that couple the sensor 22 to the substrate 18. The electrical connections 23 may be bonding wires, as shown in the Figures, or the electrical connections 23, such as solder, ball grid arrays, land grid arrays, or other connectors positioned on the underside of the sensor 22.

The substrate 18 includes a receiving region 26, which extends in a perimeter around the sensor 22 and electronic components 24 (FIG. 2). The receiving region 26 is configured to receive an insulation member 28 and is a portion of a total surface of the substrate. The dimensions of the receiving region 26 correspond to dimensions of the insulation member 28 to ensure a seal between the receiving region 26 and the lens mount 12.

Figure 4A:
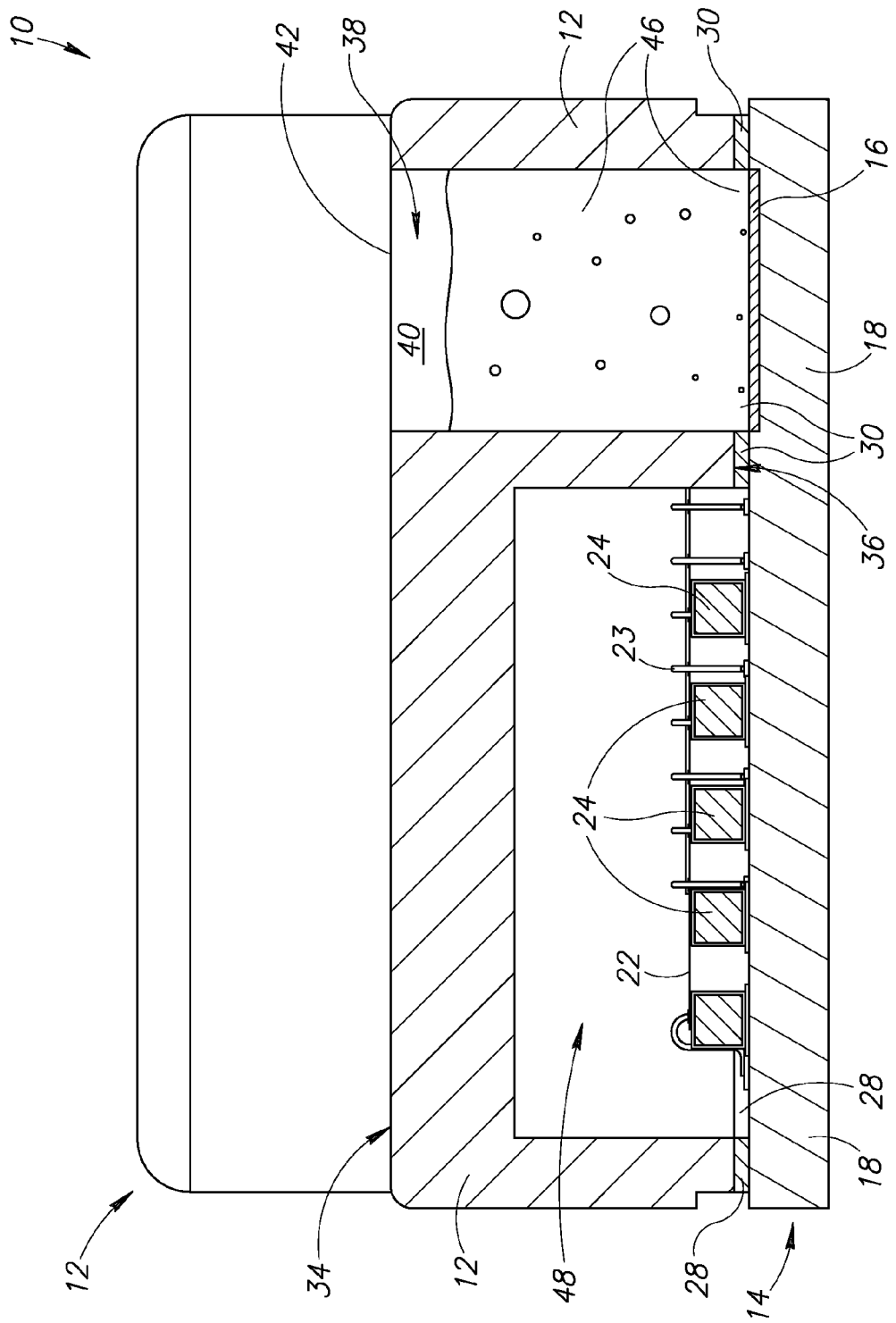
FIG. 4A is a cross-sectional view of the electronic device of FIG. 1 taken along lines 4A-4A of FIG. 1, after the conductive glue has been applied.
Figure 4B:
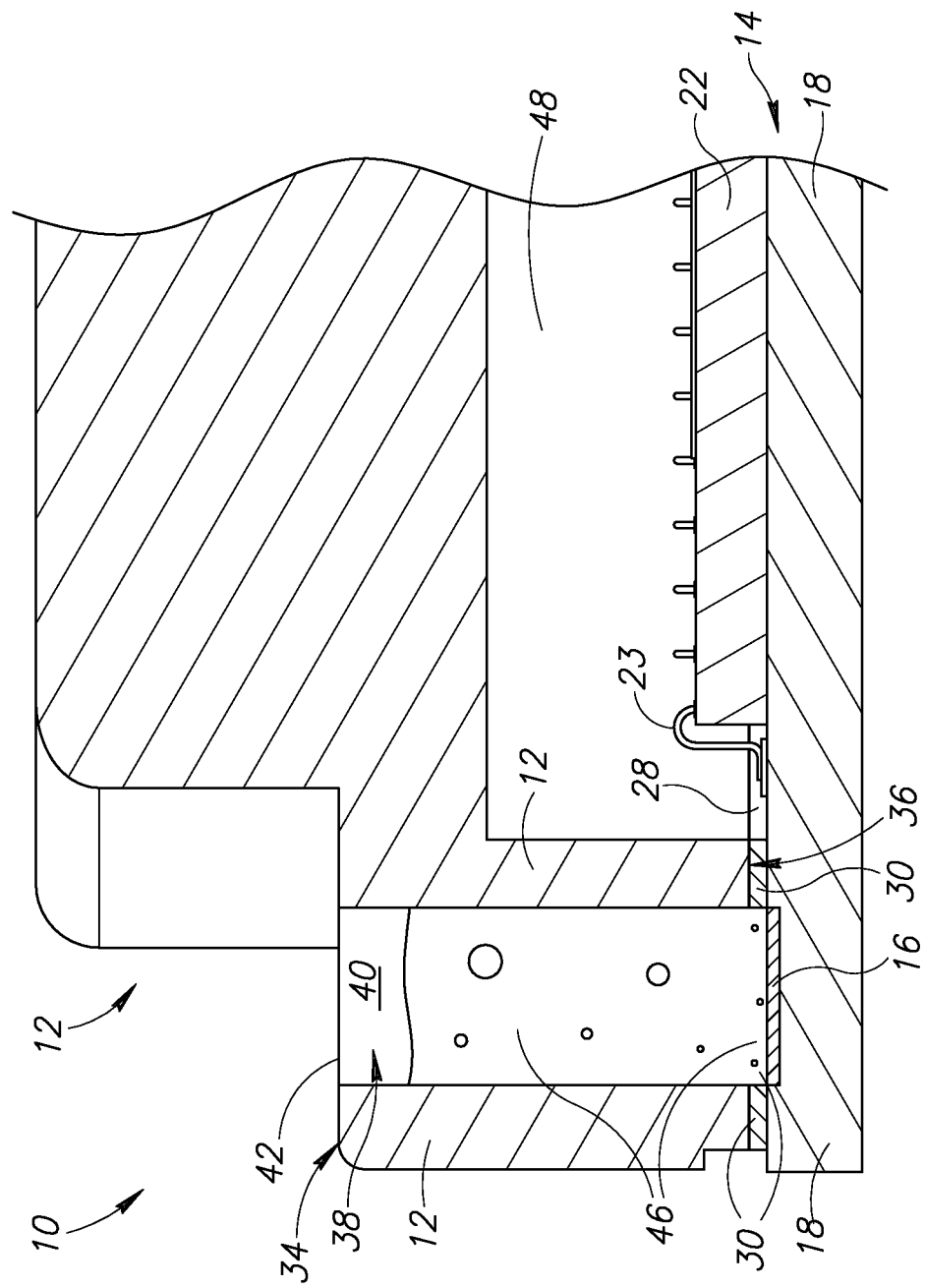
FIG. 4B is a cross-sectional view of the electronic device of FIG. 1 taken along lines 4B-4B of FIG. 1, after the conductive glue has been applied.

The insulation member 28 is positioned between the lens mount 12 and the substrate 18. The insulation member 28 is comprised of electrically insulating material to insulate the lens mount 12 from the substrate 18. The insulation member 28 may be a very thin layer of insulating material having a thickness in the range of 15-20 microns, or less, for example. This reduces the overall height of the electronic device 10 as compared to existing devices. The insulation member 28 extends around a perimeter of the sensor 22 and the electronic components 24. The insulation member 28 includes a sealing portion 30 that defines a sealing aperture 32. The sealing aperture 32 may be sized to correspond to a surface area of the grounding pad 16. Thus, the sealing portion 30 extends around and above the grounding pad 16 (FIGS. 4A and 4B). The grounding pad 16 is in electrical contact (not shown) with one of the electrical leads 20 to electrically ground the grounding pad 16 to a chassis or other grounded body of another electronic device to which the electronic device 10 may be coupled. It will be appreciated in this disclosure that the concept of "grounding the lens mount to the grounding pad and/or the circuit board" may include electrically grounding the lens mount via the grounding pad 16 and one of the electrical leads 20 to a chassis or other grounded body of another electronic device to which the electronic device 10 may be coupled.

In one embodiment, the insulation member 28 is a thin bead of insulating glue or other adhesive that is applied to the substrate in liquid form with sufficient viscosity that it does not run, then the lens mount 12 is attached and the glue is cured. In other embodiments the insulating member is a gasket, strip, or other layer that is attached to the substrate 18 by any acceptable method and has a top surface that can retain the lens mount 12 when it is cured.

Figure 3:
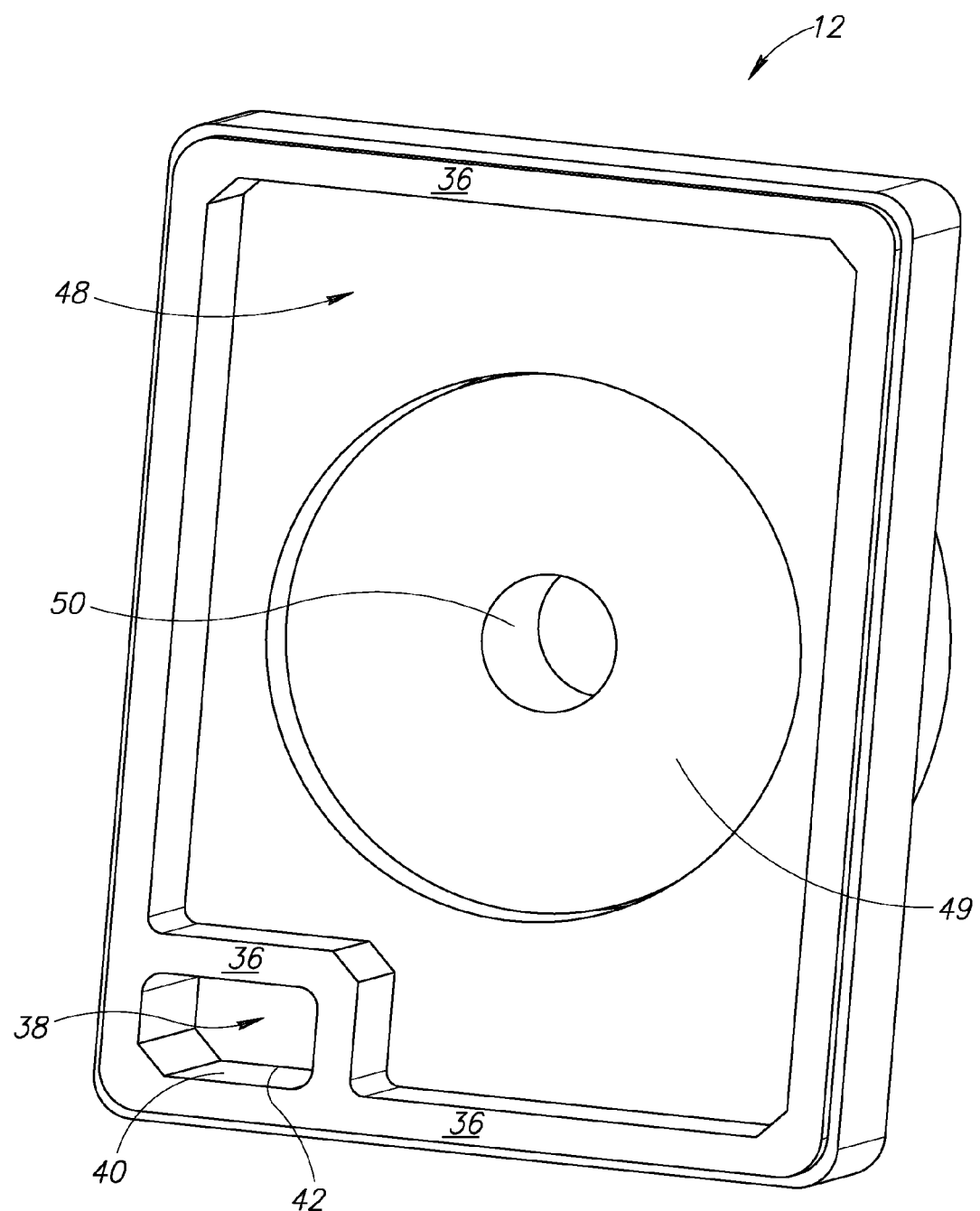
FIG. 3 is an isometric underside view of the cover of FIG. 1.

In some embodiments, the lens mount 12 includes a first surface 34 and a second surface 36 (FIGS. 2 and 3). The first surface 34 is an upper face of the lens mount 12 and the second surface 36 is lower face, in the views shown. Once the insulation member 28 is attached to the receiving surface 26, the second surface 36 is attached to the insulation member 28 having the insulation member 28 positioned between the second surface 36 and the substrate 18. The device is then cured by heat, for example, which secures the lens mount 12 to the insulation member 28 and to the substrate 18. Alternatively, the insulation member 28 is first positioned on the second surface 36 of the lens mount 12, and then the lens mount 12 may be attached to the receiving surface 26 of the substrate 18, and then the insulation member 28 may be cured. The curing process may take up to 1 to 2 hours at 90 degrees Celsius, although alternative curing methods and parameters could be used.

The lens mount 12 includes an aperture 38 that extends between the first surface 34 and the second surface 36. The aperture 38 defines a conductive surface 40 that extends the height of the aperture 38. The aperture 38 (FIGS. 2, 3, and 4A) extends from the first surface 34 to the second surface 36. The lens mount 12 is attached to the insulation member 28 and circuit board 14 such that the aperture 38 is aligned with the sealing portion 30 of the insulation member 28 and the grounding pad 16. Accordingly, a seal is formed between the aperture 38 and the substrate 18 via the insulation member 28. Once the seal is formed by the curing process, conductive glue 46 is inserted into the aperture 38 (FIGS. 4A and 4B). Accordingly, the conductive glue 46 electrically couples the lens mount 12 to the grounding pad 16. Advantageously, such coupling prevents electrostatic discharge from reaching the sensor 22 and/or the electronic components 24 via the lens mount 12. Moreover, the conductive glue 46 is sealed from the sensor 22 and electronic components 24 to prevent leakage of the conductive glue onto such electrical components.

In some aspects, the lens mount 12 is coated with an electrically conductive material to permit and/or improve electrical current between the lens mount 12, the conductive glue 46, and the grounding pad 16. In addition, the sealing aperture 32 may be sized and shaped to structurally support the lens mount 12 to the substrate 18 when the conductive glue 46 is inserted and cured therein. In other embodiments, more than one aperture (or other conductive glue receiving area) may be provided through the lens mount 12 to receive conductive glue therein, thereby providing more than one contact point of structural attachment and electrical grounding to the circuit board 14.

Thus, the size of the electrical device is suitable for use in a smartphone and will have an overall height less than the thickness of a smartphone, which is typically between 3 mm and 7 mm.

FIG. 3 shows an underside view of the lens mount 12 described with reference to FIGS. 1 and 2. The lens mount 12 includes the second surface 36, which has a surface area that substantially corresponds to a surface area of the insulation member 28 attached to the substrate 18. The opening 42 has a cross-sectional area that substantially corresponds to the surface area of the grounding pad 16 and the area of the sealing aperture 32 of the insulation member 28 (FIG. 2). The lens mount 12 includes a cavity 48 that is aligned with and covers the sensor 22 and the electronic components 24 of the circuit board 14 (FIGS. 4A and 4B). The cavity 48 creates an air filled cavity over the sensor 22. There is a circular recess 49 which provides a larger cavity over the central region of sensor 22 in one embodiment, but this is not required in all embodiments. The lens mount 12 includes a shutter hole 50 to allow passage of light to the sensor 22 so that the sensor 22 can capture an image and transfer the image to an external computing system via the electrical leads 20.

FIG. 4A shows a cross sectional view of the electronic device 10 taken along lines 4A-4A of FIG. 1, after the conductive glue has been inserted and cured. FIG. 4B shows a cross sectional view of the electronic device 10 taken along lines 4B-4B, after the conductive glue has been inserted and cured. As further discussed above, the circuit board 14 includes the grounding pad 16, the substrate 18, and the sensor 22 and electronic components 24 coupled to the substrate 18. The insulation member 28 is positioned between the lens mount 12 and the substrate 18. The insulation member 28 includes the sealing portion 30 that extends around and proximate the grounding pad 16 (FIG. 2). The lens mount 12 is sized and shaped to protect the sensor 22 from unwanted light entering into the cavity 48, thereby distorting images captured by the sensor 22 via the shutter hole 50. The lens mount 12 includes the first surface 34 and the second surface 36. The second surface 36 is attached to the insulation member 28 to electrically insulate the lens mount 12 from the substrate 18. The lens mount 12 includes the aperture 38 that extends between the first surface 34 and the second surface 36.

The aperture 38 defines the conductive surface 40 that extends through the lens mount 12. The aperture 38 includes the opening 42 to receive the conductive glue 46. The second surface 36 adjacent a lower area of the opening 42 is positioned adjacent the sealing portion 30 and adjacent the grounding pad 16. Accordingly, a seal is formed between the aperture 38 and the substrate 18.

Conductive glue 46 is inserted and positioned in the aperture 38. The conductive glue 46 may be filled in some or all of the space of the aperture 38. Any suitable conductive glue could be used. Thus, the conductive glue 46 is in electrical contact with the lens mount 12 and the grounding pad 16 to electrically ground the lens mount 12. Importantly, the conductive glue 46 is sealed off from the surrounding area external of the aperture 38 by the insulating member 28 so that the conductive glue 46 will not leak or seep onto the sensor 22 (FIG. 4B) and/or the electronic components 24 (FIG. 4A).

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising: a circuit board having a first surface; a ground pad on the first surface of the circuit board; a sensor coupled to the first surface of the circuit board, spaced from the ground pad; a cover having a first surface and a second surface, the first surface of the cover being attached to the circuit board, the cover having an internal cavity and the sensor on the circuit board being within the internal cavity; at least one through hole extending through the cover from its first surface to its second surface, the at least one through hole facing the ground pad, the through hole having conductive sidewalls; a conductive glue positioned in the through hole on the ground pad, the conductive glue electrically coupling the cover to the ground pad of the circuit board; an insulation member; and the at least one through hole, the ground pad, and the insulation member sealing the conductive glue in the at least one through hole.

2. The device of claim 1 wherein the cover includes a lens opening positioned above the sensor, the sensor being a charge-coupled device.

3. The device of claim 1 wherein the at least one through hole includes a conductive surface sized to electrically couple the conductive glue to the cover.

4. The device of claim 3 wherein the conductive surface includes a conductive layer comprised of conductive material.

5. The device of claim 1 wherein the at least one through hole is sized and shaped to cooperatively structurally support the cover to the circuit board when the conductive glue is contained in the at least one through hole.

6. The device of claim 1 wherein the distance between the first surface and the second surface is at least 20 microns or less.

7. An electronic device, comprising:
a circuit board having:
a grounding pad;
a substrate having a receiving surface adjacent to the grounding pad; and
at least one electrical component;
an electrical insulation member secured to the receiving surface, the insulation member including a sealing perimeter portion having a sealing aperture, wherein the sealing aperture is around the ground pad;
a cover having a first surface and a second surface, the second surface secured to the insulation member with the insulation member positioned between the first surface and the substrate, the cover having at least one aperture extending between the first surface and the second surface, the at least one aperture overlying the grounding pad, wherein the sealing aperture substantially corresponding to a cross-sectional area of the at least one aperture; and
a conductive glue positioned in the at least one aperture, the conductive glue electrically coupling the cover to the grounding pad.

8. The electronic device of claim 7 wherein the cover includes a lens opening positioned over the at least one electrical component.

9. The electronic device of claim 7 wherein the at least one aperture includes a conductive surface sized to electrically couple the conductive glue to the cover.

10. The electronic device of claim 7 wherein the distance between the receiving surface and the first surface is at least 20 microns or less.

11. The electronic device of claim 7 wherein the at least one aperture, the grounding pad, and the insulation member are configured to seal the conductive glue in the at least one aperture.

12. A method, comprising: grounding a cover to a circuit board, the grounding including: attaching an electrical insulation member to a surface of the circuit board; attaching the cover to the insulation member, the cover having at least one aperture positioned adjacent a grounding pad of the circuit board; inserting a conductive glue into the at least one aperture, the conductive glue configured to electrically ground the cover to the grounding pad; and sealing the conductive glue in the at least one aperture with the at least one aperture, the grounding pad, and the insulation member.

13. The method of claim 12 wherein attaching the cover comprises curing the insulation member.

14. The method of claim 12 wherein inserting the conductive glue comprises expelling the conductive glue through a tip having a diameter smaller than 400 microns.

15. The method of claim 12 wherein attaching the cover to the insulation member includes covering at least one electrical component on the circuit board, the at least one electrical component being a sensor.

16. The method of claim 12 wherein inserting the conductive glue includes electrically coupling the cover to the grounding pad.

17. The method of claim 12 wherein inserting the conductive glue includes structurally attaching the lens mount to the circuit board.

18. The method of claim 12 wherein the insulation member has a thickness less than 20 microns.

19. The method of claim 12, wherein attaching the cover to the insulation member comprises attaching the cover to the insulation member so that the at least one aperture is positioned over the grounding pad of the circuit board.

* * * * *